United States Patent
Loiseau et al.

(10) Patent No.: US 9,940,986 B2
(45) Date of Patent: Apr. 10, 2018

(54) ELECTROSTATIC DISCHARGE PROTECTION STRUCTURES FOR EFUSES

(71) Applicant: GLOBALFOUNDRIES INC., Grand Cayman (KY)

(72) Inventors: Alain F. Loiseau, Williston, VT (US); Joseph M. Lukaitis, Pleasant Valley, NY (US); Ephrem G. Gebreselasie, South Burlington, VT (US); Richard A. Poro, Bristol, VT (US); Andreas D. Stricker, Essex Junction, VT (US); Ahmed Y. Ginawi, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 182 days.

(21) Appl. No.: 14/971,644

(22) Filed: Dec. 16, 2015

(65) Prior Publication Data

US 2017/0178704 A1    Jun. 22, 2017

(51) Int. Cl.
| | |
|---|---|
| *H02H 9/04* | (2006.01) |
| *G11C 7/24* | (2006.01) |
| *H01L 23/525* | (2006.01) |
| *H01L 27/02* | (2006.01) |
| *H01L 27/06* | (2006.01) |
| *H01L 27/112* | (2006.01) |
| *G11C 5/00* | (2006.01) |
| *G11C 17/16* | (2006.01) |

(52) U.S. Cl.
CPC ............ *G11C 7/24* (2013.01); *G11C 5/005* (2013.01); *G11C 17/16* (2013.01); *H01L 23/5256* (2013.01); *H01L 27/0255* (2013.01); *H01L 27/0266* (2013.01); *H01L 27/0617* (2013.01); *H01L 27/11206* (2013.01)

(58) Field of Classification Search
CPC ................................. H02H 9/04; H02H 9/041
USPC .......................................................... 361/56
See application file for complete search history.

(56) References Cited

U.S. PATENT DOCUMENTS

| | | |
|---|---|---|
| 5,818,285 A | 10/1998 | Lee et al. |
| 6,469,884 B1 | 10/2002 | Carpenter, Jr. et al. |
| 6,882,214 B2 | 4/2005 | Spanea et al. |
| 7,072,157 B2 | 7/2006 | Kitagawa |

(Continued)

FOREIGN PATENT DOCUMENTS

| | | |
|---|---|---|
| TW | 358945 | 5/1990 |
| TW | 200609972 | 3/2006 |

(Continued)

OTHER PUBLICATIONS

TW-200711092, Entire specification and drawings.*

(Continued)

*Primary Examiner* — Dharti Patel
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to electrostatic discharge (ESD) protection structures for eFuses. The structure includes an electrostatic discharge (ESD) protection structure operatively coupled to an eFuse, which is structured to prevent unintentional programming of the eFuse due to an ESD event originating at a source.

20 Claims, 5 Drawing Sheets

(56) References Cited

U.S. PATENT DOCUMENTS

| | | |
|---|---|---|
| 7,271,988 B2 | 9/2007 | Chung et al. |
| 7,271,989 B2 | 9/2007 | Huang et al. |
| 7,518,843 B2 | 4/2009 | Wu et al. |
| 8,009,397 B2 | 8/2011 | Etherton et al. |
| 8,259,428 B2 | 9/2012 | Mollema et al. |
| 2007/0053121 A1 | 3/2007 | Chang et al. |
| 2009/0189226 A1 | 7/2009 | Yamamoto et al. |
| 2009/0225481 A1 | 9/2009 | Abou-Khalil et al. |
| 2012/0299630 A1 | 11/2012 | Sakurai et al. |

FOREIGN PATENT DOCUMENTS

| | | |
|---|---|---|
| TW | 200711092 | 3/2007 |
| TW | 200735170 | 9/2007 |
| TW | 200943663 | 10/2009 |
| TW | 201222788 | 6/2012 |
| TW | 201320583 | 5/2013 |

OTHER PUBLICATIONS

TW201320586, Entire specification and drawings.*
TW Office Action in related TW Application No. 105100696 dated Mar. 13, 2017, 11 pages.
TW Office Action in related TW Application No. 105100696 dated Oct. 19, 2017, 7 pages.

* cited by examiner

ELECTROSTATIC DISCHARGE PROTECTION STRUCTURES FOR EFUSES

The present disclosure relates to semiconductor structures and, more particularly, to electrostatic discharge (ESD) protection structures for eFuses.

BACKGROUND

An eFuse is a technology which allows for the dynamic real-time reprogramming of computer chips. By utilizing a set of eFuses, a chip manufacturer can allow for the circuits on a chip to change while it is in operation. The primary application of this technology is to provide in-chip performance tuning. For example, if certain sub-systems fail, or are taking too long to respond, or are consuming too much power, the chip can instantly change its behavior by "blowing", or programming, an eFuse.

By design, e-Fuses are sensitive to large currents and voltages, e.g., 1.5V for 100 ns. For example, by forcing a large current through the eFuse, it can be blown or programmed; breaking the eFuse structure resulting in an electrical open. During an ESD event, the voltage on the supply can increase to a high level of several volts. Since the supply voltage of the control circuit and the circuitry generating the program enable signal is not actively powered during the ESD event, the outputs of these circuits can be in an undefined state during the ESD event. This may create conditions for unwanted eFuse programming. As a result, with currently used eFuses, there is a risk that the eFuses are programmed by high voltages and currents that can occur during an undesirable ESD event.

More specifically, during a negative pulse on the supply rail of the eFuse circuit (referred to as Vf source), an ESD current will primarily go through the ESD device, however, some current will also pass through the parasitic body/drain diode of a current source NFET. As should be recognized, the current source of the NFET is used to drive current through the eFuse when programming the eFuse, but the negative pulse through the body/drain diode of a current source NFET during the ESD event can also go through the eFuse. This current might damage the un-programmed eFuse.

SUMMARY

In an aspect of the disclosure, a structure includes an electrostatic discharge (ESD) protection structure operatively coupled to an eFuse. The ESD protection structure is structured to prevent unintentional programming of the eFuse due to an ESD event originating at a source.

In an aspect of the disclosure, a structure includes: an eFuse connected between a terminal potentially exposed to an ESD source and a FET network having a parasitic current upon an occurrence of an ESD event; an ESD protection structure coupled to the eFuse which is structured to prevent negative pulses originating at the ESD source from unintentionally programming; a power clamp which is structured to protect the eFuse by discharging a positive pulse current; and a diode in parallel with the power clamp, which is structured to protect the eFuse by discharging a negative pulse current.

In an aspect of the disclosure, a method comprises, during an ESD event, diverting of a parasitic current originating at a FET network from an eFuse to a forward biased diode such that the eFuse will not be unintentionally programmed.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to electrostatic discharge (ESD) protection structures for eFuses. More specifically, the present disclosure relates to a diode (or FET) operatively coupled to an eFuse to prevent unintentional programming of the eFuse (e.g., due to an ESD event). Advantageously, the circuitry described herein provides improved reliability and yield improvements, particularly in view of the fact that the eFuse is no longer stressed during an ESD event with a negative voltage. Also, since negative voltage ESD events are no longer an issue by implementing the circuitry described herein, eFuse damage from positive ESD events can be avoided by making sure that the channel of the NFET current source does not conduct by ensuring that Vgs=0.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
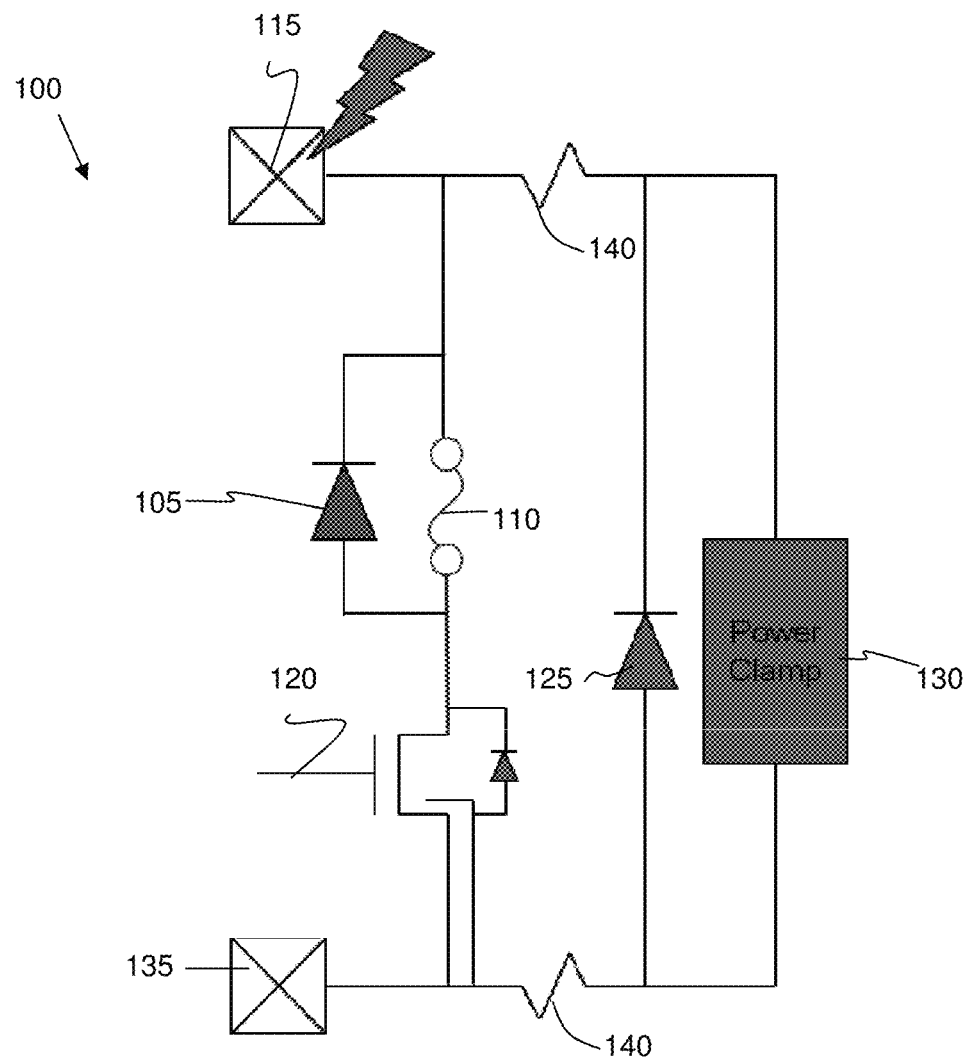
FIG. 1 shows a circuit with a diode ESD protection structure in accordance with aspects of the present disclosure.

FIG. 1 shows a circuit with an ESD protection structure in accordance with aspects of the present disclosure. In FIG. 1, the circuit 100 includes an ESD protection structure comprising a diode 105 in parallel with an eFuse 110. In embodiments, both terminals of the eFuse 110 and the diode 105 are shared terminals, with one of the terminals directly coupled to Vf source 115 (ESD terminal). In embodiments, the diode 105 will ensure that a voltage across the eFuse 110 is clamped during a negative pulse on Vf source 115. More specifically, during an ESD event, the diode 105 can be forward biased such that parasitic current from a FET network 120 will not unintentionally program the eFuse 110. This advantage is accomplished by diverting the current from the eFuse 110 through the diode 105 to the ESD pad (e.g., Vf source 115). During normal operation, the diode 110 is reverse biased and will not impact use.

The circuit 100 further includes a diode 125 in parallel with a power clamp 130. The diode 125 is preferably larger than the diode 105, and will absorb the majority of a negative ESD event originating from the Vf source 115; that is, the diode 125 will protect the eFuse 110 during a negative pulse originating from Vf source 115 by turning on and allowing the current on the eFuse 110 to stay low. The diode 105, though, is of sufficient size, e.g., about 5 microns in width, to ensure that any parasitic current from the FET network 120 which may flow through the eFuse 110 is below its threshold (e.g., lower than 1.5 volts or a voltage that will not program the eFuse 110). In this way, the eFuse 110 will not blow (e.g., will not be programmed due to an ESD event) due to a negative ESD event occurring at Vf source 115, which can be passed from the FET network 120 as a parasitic current. In embodiments, the power clamp 130 is used to protect the eFuse 110 by discharging a positive pulse current. The circuit 100 further includes GND 135 and a plurality of bus resistances 140.

It should be recognized that other voltage thresholds and parameters of the diode 105 are contemplated by the present disclosure. Accordingly, the size of the diode 105 and its current capacity are provided herein as illustrative, non-limiting examples. For example, in embodiments, the diode 105 can be of any appropriate size, e.g., big enough, to carry the current flowing from the FET network 120 (parasitic diode) so that only a low voltage is applied to the eFuse 110, e.g., a voltage which would not program the eFuse 110.

Figure 2:
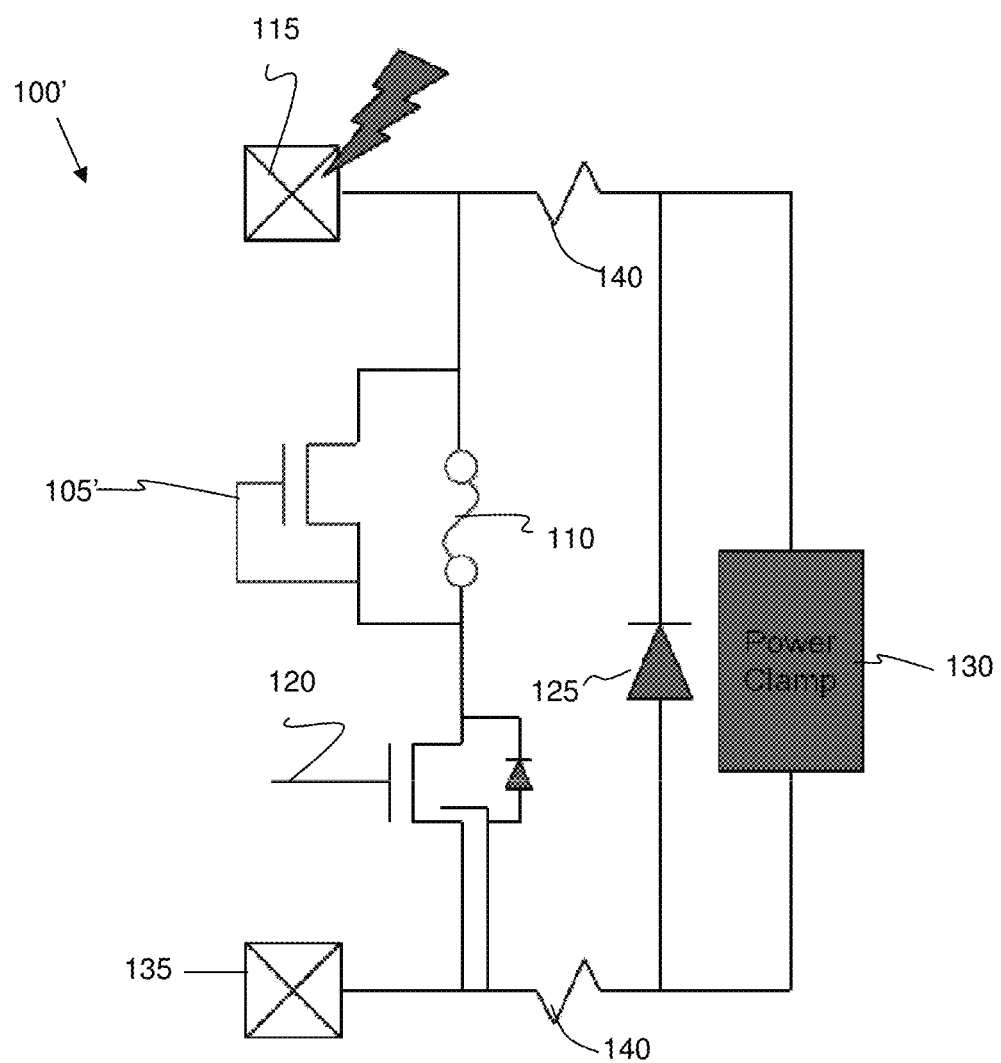
FIG. 2 shows a circuit with a FET ESD protection structure in accordance with additional aspects of the present disclosure.

FIG. 2 shows a circuit with an ESD protection structure in accordance with additional aspects of the present disclosure. In FIG. 2, the circuit 100' includes an ESD protection structure comprising a FET 105' in parallel with an eFuse 110. The circuit 100' includes the remaining components of the circuit 100 of FIG. 1, e.g., a diode 125 in parallel with a power clamp 130, GND 135 and a plurality of bus resistances 140.

In embodiments, the FET 105' can be a device with low turn on voltage with the gate of the FET 105' connected to the source, e.g., Vf source 115 (ESD terminal). An advantage of using the FET 105' is that turn on voltage (Vt) can be chosen and can be lower than a regular diode. In embodiments, the FET 105' will ensure that a voltage across the eFuse 110 is clamped during a negative pulse on Vf source 115. More specifically, during an ESD event, the parasitic current from a FET network 120 will pass through the FET 105' ensuring that the eFuse 110 is not unintentionally programmed. One skilled in the art will recognize that although FIG. 1 shows a diode and FIG. 2 shows a N-type FET, other devices such as Schottky diodes, PIN diodes, and P-type FET can be used to achieve the same benefits and are within the scope of this disclosure.

Figure 3:
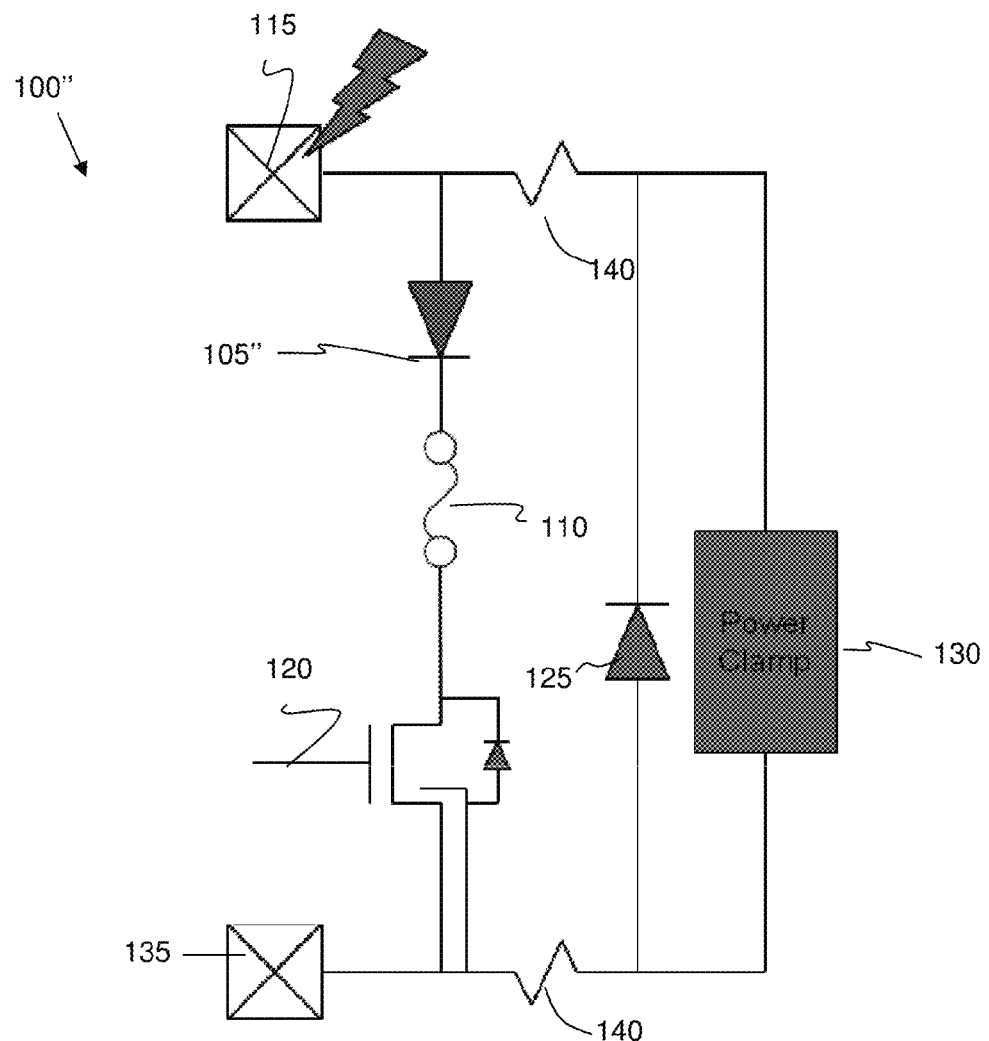
FIG. 3 shows a circuit with a diode ESD protection structure in accordance with additional aspects of the present disclosure.

FIG. 3 shows a circuit with an ESD protection structure in accordance with additional aspects of the present disclosure. In FIG. 3, the circuit 100" includes an ESD protection structure comprising a diode 105" in series with an eFuse 110. The circuit 100" includes the remaining components of the circuit 100 of FIG. 1, e.g., a diode 125 in parallel with a power clamp 130, GND 135 and a plurality of bus resistances 140.

Still referring to FIG. 3, in one embodiment, the diode 105" has a terminal directly coupled to Vf source 115 (ESD terminal), with its cathode terminal connected directly to the terminal of the eFuse 110. In this example, the diode 105" is placed above the eFuse 110 such that the cathode of the diode is operatively coupled to the anode of the eFuse. In another embodiment, the diode 105" can be placed below the eFuse 110 such that the cathode of the eFuse is operatively connected to the anode of the diode, in which case the diode 105" has its terminals coupled directly to both the eFuse 110 and the FET network 120, e.g., cathode terminal is connected to a the FET network 120 and its anode terminal connected to the eFuse.

In embodiments where the diode 105" has its terminal directly coupled to Vf source 115, the diode 105" will block current from a negative ESD pulse (originating from Vf source 115) to flow through the eFuse 110. That is, the diode 105" is reverse biased during an ESD event, which prevents a voltage from forming across the eFuse 110 above its threshold. However, in normal operation, the diode 105" will reduce the voltage the eFuse 110 is exposed to, hence requiring a larger current source or a larger Vf source voltage. As should be recognized by those of ordinary skill in the art, the diode 105" is forward biased under normal operation.

Similarly, where the diode 105" has a terminal directly coupled to both the eFuse 110 and the FET network 120, during an ESD event the diode 105" will be reverse biased and will ensure that parasitic current from the FET network 120 will be blocked and will not unintentionally program the eFuse 110. As described already herein, the diode 105" can be designed with certain size and current capacity to carry the desired programming current during normal operation.

Figure 4:
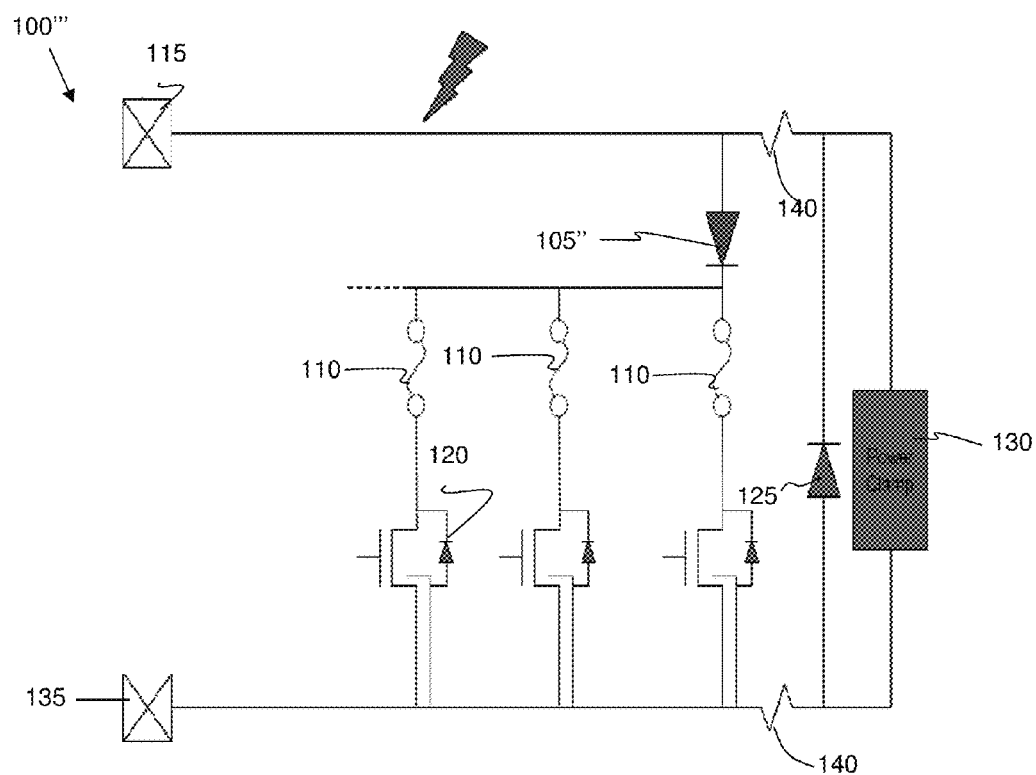
FIG. 4 shows a circuit with a diode ESD protection structure in accordance with additional aspects of the present disclosure.

FIG. 4 shows a circuit with an ESD protection structure in accordance with additional aspects of the present disclosure. In FIG. 4, the circuit 100'" includes an ESD protection structure comprising a diode 105" in series with multiple eFuses 110 (e.g., a bank of eFuses 110). As in the embodiment of FIG. 3, the diode 105" will block current from a negative ESD pulse (originating from Vf source 115) to flow through the eFuses 110. That is, the diode 105" is reverse biased during an ESD event, which prevents a voltage from forming across the eFuses 110 above their threshold.

As should be recognized by those of ordinary skill in the art, the diode 105" is forward biased under normal operation. Also, in normal operation, the diode 105" will reduce the voltage the eFuses 110 are exposed to, hence requiring a larger current source or a larger Vf source voltage. The circuit 100'" further includes the remaining components of the circuit 100 of FIG. 1, e.g., a diode 125 in parallel with a power clamp 130, GND 135 and a plurality of bus resistances 140.

Figure 5:
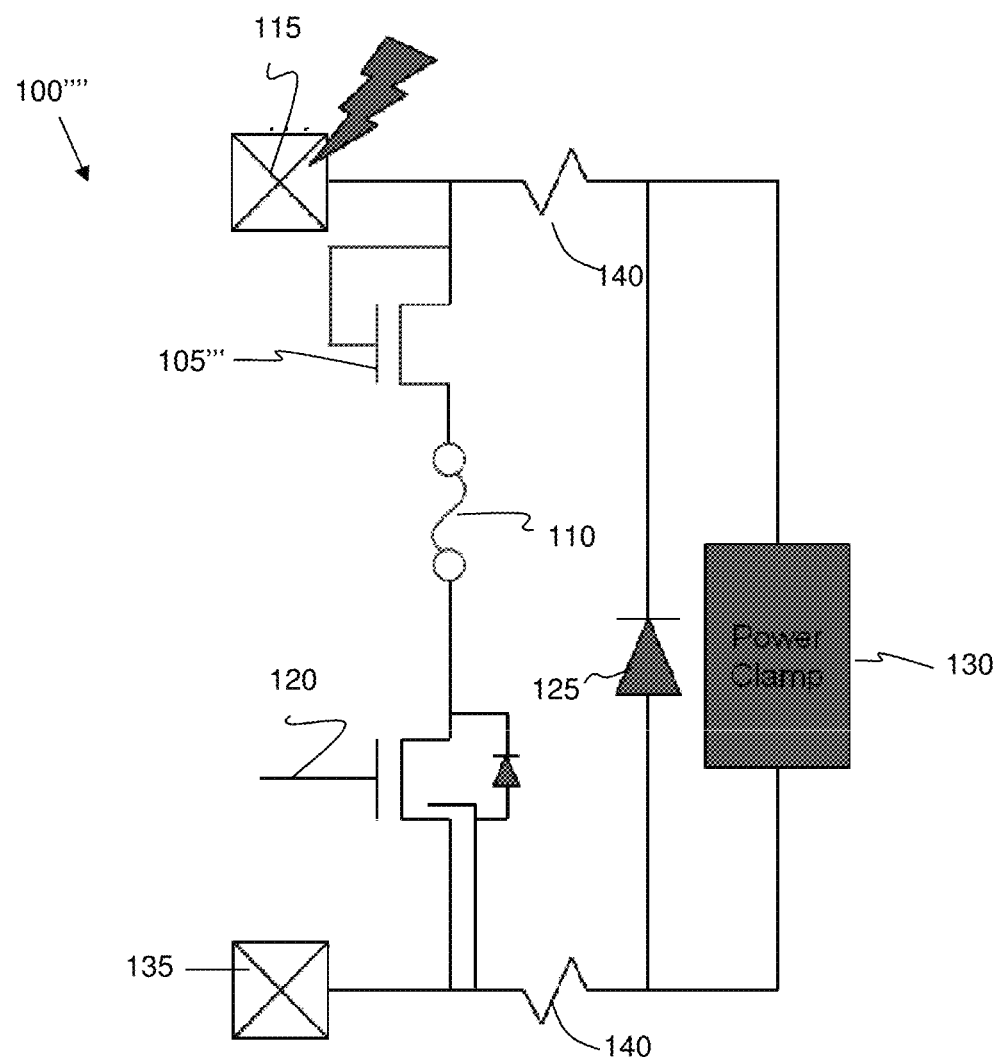
FIG. 5 shows a circuit with a FET ESD protection structure in accordance with additional aspects of the present disclosure.

FIG. 5 shows a circuit with an ESD protection structure in accordance with additional aspects of the present disclosure. In FIG. 5, the circuit 100"" includes an ESD protection structure comprising a FET 105'" in series with an eFuse 110. In embodiments, the FET 105'" has a terminal directly coupled to Vf source 115 (ESD terminal) and another terminal (e.g., drain) connected to the eFuse 110. In this example and during a negative pulse on Vf source 115, the FET 105'" will block the ESD current from going through the eFuse 110. Also, an advantage of using the FET 105'" is that turn on voltage (Vt) can be chosen and can be lower than a regular diode. The circuit 100"" further includes the remaining components of the circuit 100 of FIG. 1, e.g., a diode 125 in parallel with a power clamp 130, GND 135 and a plurality of bus resistances 140. In embodiments, the FET 105'" can be replaced with a Schottky diode or PIN diodes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising an electrostatic discharge (ESD) protection structure operatively coupled to an eFuse, the ESD protection structure being structured to prevent unintentional programming of the eFuse due to an ESD event originating at a source and a power clamp which is structured to protect the eFuse by discharging a positive pulse current.

2. The structure of claim 1, wherein the ESD protection structure is a diode formed in parallel with the eFuse, wherein both terminals of the eFuse and the diode are each shared terminals.

3. The structure of claim 2, wherein one of the terminals of the diode are directly coupled to the source.

4. The structure of claim 2, wherein the diode is forward biased during the ESD event and reverse biased during normal operation.

5. The structure of claim 4, wherein the diode is clamped during a negative pulse such that parasitic current from a FET network will not unintentionally program the eFuse.

6. The structure of claim 1, wherein the ESD protection structure is a diode formed in series with the eFuse.

7. The structure of claim 6, wherein the diode is reverse biased during the ESD event and forward biased during normal operations.

8. The structure of claim 7, wherein the diode prevents a voltage from forming across the eFuse above its threshold.

9. The structure of claim 6, wherein the diode is coupled in series to a bank of eFuses.

10. The structure of claim 6, wherein the diode is between the eFuse and a FET network.

11. The structure of claim 1, wherein one of:
the ESD protection structure is a FET in parallel with the eFuse; and
the ESD protection structure is a FET in series with the eFuse, where a terminal of the FET is connected to the source.

12. The structure of claim 1, further comprising a diode in parallel with the power clamp, the diode absorbing a negative ESD event originating from the source to protect the eFuse during a negative pulse originating from the source by turning on and allowing current on the eFuse to stay low.

13. A structure, comprising:
an eFuse connected between a terminal potentially exposed to an ESD source and a FET network having a parasitic current upon an occurrence of an ESD event;
an ESD protection structure coupled to the eFuse which is structured to prevent negative pulses originating at the ESD source from unintentionally programming the eFuse;
a power clamp which is structured to protect the eFuse by discharging a positive pulse current; and
a diode in parallel with the power clamp, which is structured to protect the eFuse by discharging a negative pulse current.

14. The structure of claim 13, wherein the ESD protection structure is a diode formed in parallel with the eFuse, wherein both terminals of the eFuse and the diode are each shared terminals.

15. The structure of claim 14, wherein the diode is forward biased during the ESD event and reverse biased during normal operation.

16. The structure of claim 13, wherein:
the ESD protection structure is a diode formed in series with the eFuse;
the diode is reverse biased during an ESD event and forward biased during normal operations; and
the diode prevents a voltage from forming across the eFuse above its threshold.

17. The structure of claim 16, wherein the diode is coupled in series to a bank of eFuses.

18. The structure of claim 13, wherein the ESD protection structure is a FET in parallel with the eFuse.

19. The structure of claim 13, wherein the ESD protection structure is a FET in series with the eFuse, where a terminal of the FET is connected to the source.

20. A method comprising, during an ESD event, diverting of a parasitic current originating at a FET network from an eFuse to a forward biased diode to discharge a negative pulse current such that the eFuse will not be unintentionally programmed and a power clamp which protects the eFuse by discharging a positive pulse current.

* * * * *